United States Patent [19]

Rupp

[11] 4,132,949
[45] Jan. 2, 1979

[54] METHOD AND APPARATUS FOR THE CONTINUOUS, CONTACTLESS TESTING OF AN ELONGATED CONDUCTOR WHICH CONSISTS AT LEAST PARTIALLY OF SUPERCONDUCTIVE MATERIAL

[75] Inventor: Günter Rupp, Nüremberg, Germany

[73] Assignee: Siemens Aktiengesellschaft, Munich, Germany

[21] Appl. No.: 760,988

[22] Filed: Jan. 21, 1977

[30] Foreign Application Priority Data

Feb. 18, 1976 [DE] Fed. Rep. of Germany ....... 2606504

[51] Int. Cl.² .......................................... G01R 33/12
[52] U.S. Cl. .................................... 324/224; 324/227; 324/232; 324/238
[58] Field of Search .................... 324/34 R, 34 SC, 37, 324/40; 29/593, 599

[56] References Cited

U.S. PATENT DOCUMENTS 3,500,181  3/1970  Jackson ................................. 324/37
3,976,934  8/1976  Voigt et al. ...................... 324/34 SC Primary Examiner—Robert J. Corcoran
Attorney, Agent, or Firm—Kenyon & Kenyon, Reilly, Carr & Chapin

[57] ABSTRACT

To test a conductor with superconductive material which is in the superconducting state, the conductor is led through an external magnetic field which comprises at least two magnetic field regions spatially separated from each other and arranged one behind the other in the lengthwise direction of the conductor, the fields of which are angularly displaced from each other in the circumferential direction relative to the longitudinal axis of the conductor permitting disturbances in all superconductivity regions in superconductors of any cross section to be ascertained with certainty.

3 Claims, 5 Drawing Figures

METHOD AND APPARATUS FOR THE CONTINUOUS, CONTACTLESS TESTING OF AN ELONGATED CONDUCTOR WHICH CONSISTS AT LEAST PARTIALLY OF SUPERCONDUCTIVE MATERIAL

BACKGROUND OF THE INVENTION

This invention related to the testing of superconducting conductors in general and move particularly to an improved method and apparatus for carrying out such testing. U.S. Pat. No. 3,976,934 teaches a method for the continuous, contactless testing of an elongated conductor which consists at least partially of superconductive material. The conductor, with the superconductive material which is in the superconducting state, is moved through an external magnetic field which induces shielding currents in the superconductive material. The magnetic field generated by these shielding currents is measured. The corresponding apparatus for implementing this method contains a cryostat in which a cylindrical superconducting magnet coils for generating the external magnetic field is arranged. Further, means are provided in the cryostat for introducing the conductor into the magnetic field of the superconductor magnet coil approximately parallel to the axis of the coil, for deflecting the conductor at right angles to the coil axis and, thereby, to the external magnetic field, and for bringing the conductor out again approximately parallel to the coil axis, as well as at least one magnetic field probe arranged in the vicinity of the deflection point.

The known method and the corresponding apparatus are based on the measurement principle of pulling the conductor, in the superconducting state, through a magnetic field, such that superconducting shielding currents are induced, and then measuring the field of these currents. Since disturbances in the superconductor affect its shielding currents and thereby, their own fields outside the superconductive material, the field changes connected therewith can be measured by means of magnetic field measuring probes and be correlated with the corresponding points of the conductor.

The known method and the corresponding apparatus are particularly well suited for ribbon shaped superconductors. If, however, elongated conductors having a superconducting layer which extends to a large degree in three dimensions, e.g., a cylindrically shaped layer, are to be tested for freedom from defects with this known method and apparatus, then there may be surface areas in which defects are not registered reliably.

SUMMARY OF THE INVENTION

It is therefore an object of the present invention to improve the known method and the known apparatus in a manner such that disturbances in all superconductor regions can be detected with certainty in superconductor of any cross section.

Starting with the basic method mentioned above, the solution of this problem is to move the conductor through an external magnetic field which comprises at least two magnetic field regions which are spatially separated from each other and are arranged one behind the other in the lengthwise direction of the conductor, and the fields of which are fixed but angularly displaced with respect to each other in the circumferential direction about the longitudinal axis of the conductor.

In testing an elongated conductor, the superconducting layer of which extends to a large degree in three dimensions, it is possible to obtain information regarding the freedom from defects of a part of the superconducting layer in each magnetic field region on the basis of the field changes connected with defects in the superconducting layer. The advantages of the method according to the present invention are, in particular, that several magnetic field regions are provided, the fields of which can be aligned among each other in such a manner that the information from all magnetic field regions permits determining the freedom from defects of the entire superconducting layer.

For implementing the method according to the present invention, an apparatus which contains means for deflecting the direction in which the conductor is guided within a cryostat and which is equipped in the deflection region with at least two magnet coils with coils axes approximately perpendicular to the conductor axis for generating the two magnetic field regions and which contains two magnetic field probes which are disposed on both sides of the conductor in the direction of the field in each of the two magnetic field regions, is particularly well suited. For conductors with circular cross section, it is, in particular, advantageous to provide two magnetic field regions with two magnet coils each on both sides of the conductor, the coil axis of the first pair of magnet coils being angularly displaced relative to the second pair of magnet coils by about 90° in the direction of the circumference of the conductor.

DETAILED DESCRIPTION OF THE INVENTION

Figure 1:
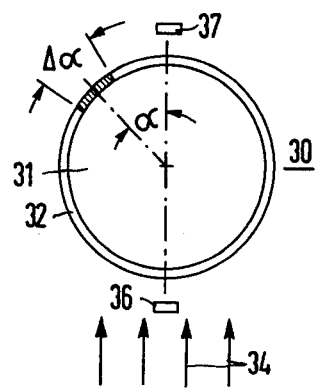
FIG. 1 is a schematic illustration of a portion of a prior art measuring device.

In FIG. 1, a measuring device according to U.S. Pat. No. 3,976,934 is partially shown in a cross section. A conductor 30 to be tested contains a normally conducting core 31 which is surrounded by a superconducting layer 32. An aluminum wire of circular cross section on the outside of which a niobium layer is applied may be provided as the conductor core. However, the superconductive material need not complete enclose a normally conducting core with a thin outer layer. It may also be distributed over part of the conductor cross section or over the entire conductor cross section.

The conductor 30 is assumed to be in the superconducting state and is moved through an external magnetic field. This magnetic field is illustrated by individual field vectors 34, which are disposed substantially perpendicular to a plane in which the axis of the conductor lies. Because of the generally relatively large three-dimensional extent of the superconducting layer 32 of the conductor 30 in the direction of the field vectors 34, it is advisable to provide two Hall probes 36 and 37. These two Hall probes are arranged in the direction of the field diametrically opposed with respect to the conductor near the surface of the conductor. The Hall effect voltages generated in them are advantageously added.

Figure 2:
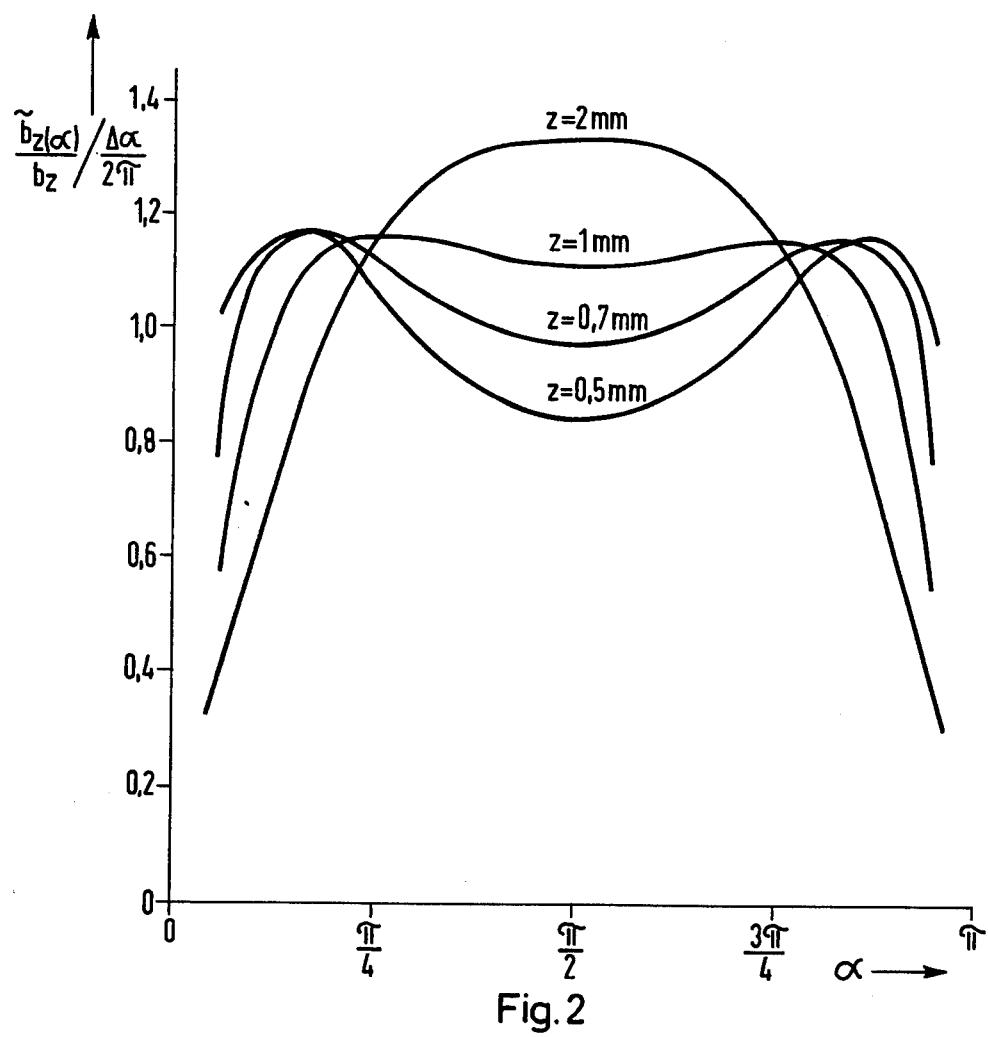
FIG. 2 is a diagram illustrating the location dependence of the defect signal of the apparatus of FIG. 1.
Figure 3:
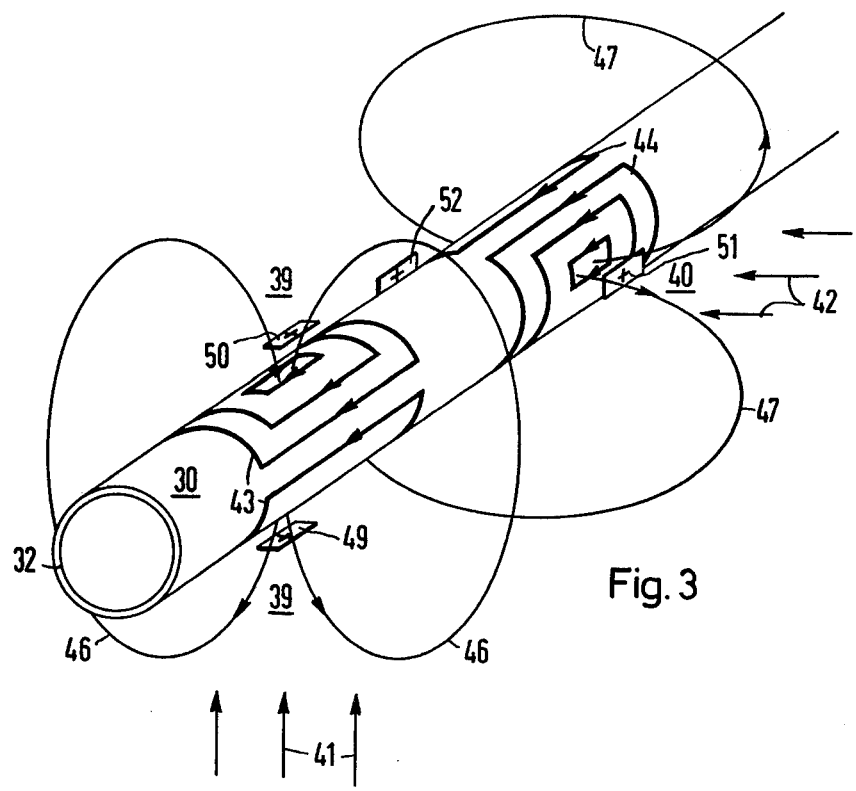
FIG. 3 is a perspective view of a measuring apparatus according to the present invention.

The following simplifying assumptions can be made to estimate the effect to defect areas on the measuring signal produced. As shown in the figure, a defective part of the conductor layer 32 of the conductor 30 of size $\Delta\alpha$ is assumed to be at an angle $\alpha$ to the direction of the field vectors 34 and carry no current. The change of the Hall probe signal associated therewith is shown on the diagram of FIG. 2. The calculated curves of this diagram are based on an aluminum wire of 2 mm diameter as well as on different distances z of the Hall probe from the surface of the wire. The value $b_z$ designates the sum of the fields generated by the induced current in the undisturbed conductor at the location of the two Hall probes; and $b_x(\alpha)$ designates the sum of the missing fields of the conductor area $\Delta\alpha$ at the angle $\alpha$ also at the location of the two Hall probes. In the diagram of the figure, that fraction of the field generated by the induced current as well as the superconducting layer are reduced by the same fraction. Values larger or smaller than 1 indicate more or less relative change of the field generated by the induced current in comparison to the change of the superconducting layer. As can be seen from the diagram of the figure, a defect at an angle $\alpha$ of about 90° can be registered very well, while a corresponding defect at an angle $\alpha = 0$ or 180° causes practically no signal change. For this reason, and as shown schematically in FIG. 3, the magnetic field according to the present invention, through which the conductor 30 must run, comprises two magnetic field regions 39 and 40 which are staggered in the longitudinal direction of the conductor. The field vectors, 41 of the magnetic field region 39 are angularly displaced relative to the corresponding field vectors 42 of the magnetic field region 40 by about 90° in the circumferential direction of the conductor. Thus, the defects occurring in a superconducting layer 32, i.e., particularly cracks, for instance, several centimeters long, in the axial direction can lead distinctly to signal changes at the Hall probes, although the zone designated with $\Delta\alpha$ according to FIG. 1 may be very small.

When the conductor 30 is moved through the magnetic field regions 39 and 40, shielding currents which are indicated by lines 43 and 44, are induced in its superconducting layer 32. Each magnetic field connected with these shielding currents and indicated by individual field vectors 46 and 47, respectively, is thus superimposed on the magnetic fields 41 and 42, respectively. The magnetic field changes connected therewith can be measured according to FIG. 1 by two Hall probes for each field of which in the figure the Hall probes associated with the magnetic field region 39 are designated 49 and 50 and the Hall probes associated with the magnetic field region 40 are designated 51 and 52.

Figure 4:
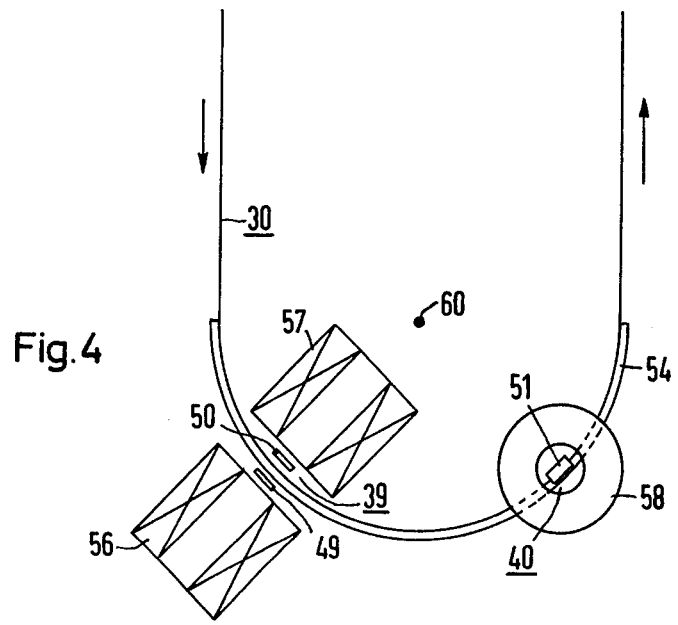
FIG. 4 is a view of an embodiment of an apparatus according to FIG. 3.

In FIG. 4, a longitudinal cross section through part of a measuring apparatus according to the present invention is shown. The conductor 30 to be tested, which is cooled down to superconductivity, is introduced into a cryostat (not shown in the figure) which is filled, for instance, with liquid helium. It is brought out of the cryostat again in the opposite direction by means of a deflecting device 54, e.g., a track bent in semicircular shape. On the way along the deflection track 54, the conductor runs through two magnetic field regions 39 and 40 according to FIG. 3. The magnetic fields of these magnetic field regions are generated, according to FIG. 4, for instance, by two magnetic field coils per field region which are arranged on both sides of the conductor and which may be normally conducting or superconducting eletromagnets. The two magnet coils 56 and 57 assigned to the magnetic field region 39 are shown in the figure in a longitudinal cross section. Of the magnet coils assigned to the magnetic field region 40, only one magnet coil 58 is visible in cross section in the figure. This coil just covers up the magnet coil opposite it. The two magnet coils of this magnetic field region correspond as to their geometric dimensions, for instance, to the two magnet coils 56 and 57. The magnetic field produced by the magnet coils 56 and 57 is aligned approximately perpendicular to the conductor axis and approximately radially with respect to the semicircular deflection device 54. The two magnet coils of the magnetic field region 40 are angularly displaced relative to the magnet coils 56 and 57 by about 90° in the circumferential direction of the conductor axis and approximately parallel to the axis 60, of the semicircular deflection device 54. Between each of the pairs of magnet coils of the two magnetic field regions 39 and 40, two Hall probes are arranged in the direction of the generated magnetic fields on both sides of the conductor 30. In the view of FIG. 4, the two Hall probes 49 and 50 associated with the magnet coils 56 and 57 can be seen, while the Hall probe 51 associated with the magnet coil 58 just covers up the opposite Hall probe on the other side of the conductor. For a diameter of 2 mm of the conductor 30, about 1 mm is advantageously chosen as the distance of these Hall probes from the conductor surface, while a distance of 1.5 mm is advantageously provided for a 3 mm conductor.

The Hall voltages of the two Hall probes of each pair of magnet coils can advantageously be added and compensated about the Hall voltage of the applied field. These Hall voltages $U_H$ of the two magnetic field regions 39 and 40, cancelled in this manner, can now be fed to a multiple recorder. Thus, the measuring signals from the two magnetic field regions can be recorded independently of one another.

Figure 5:
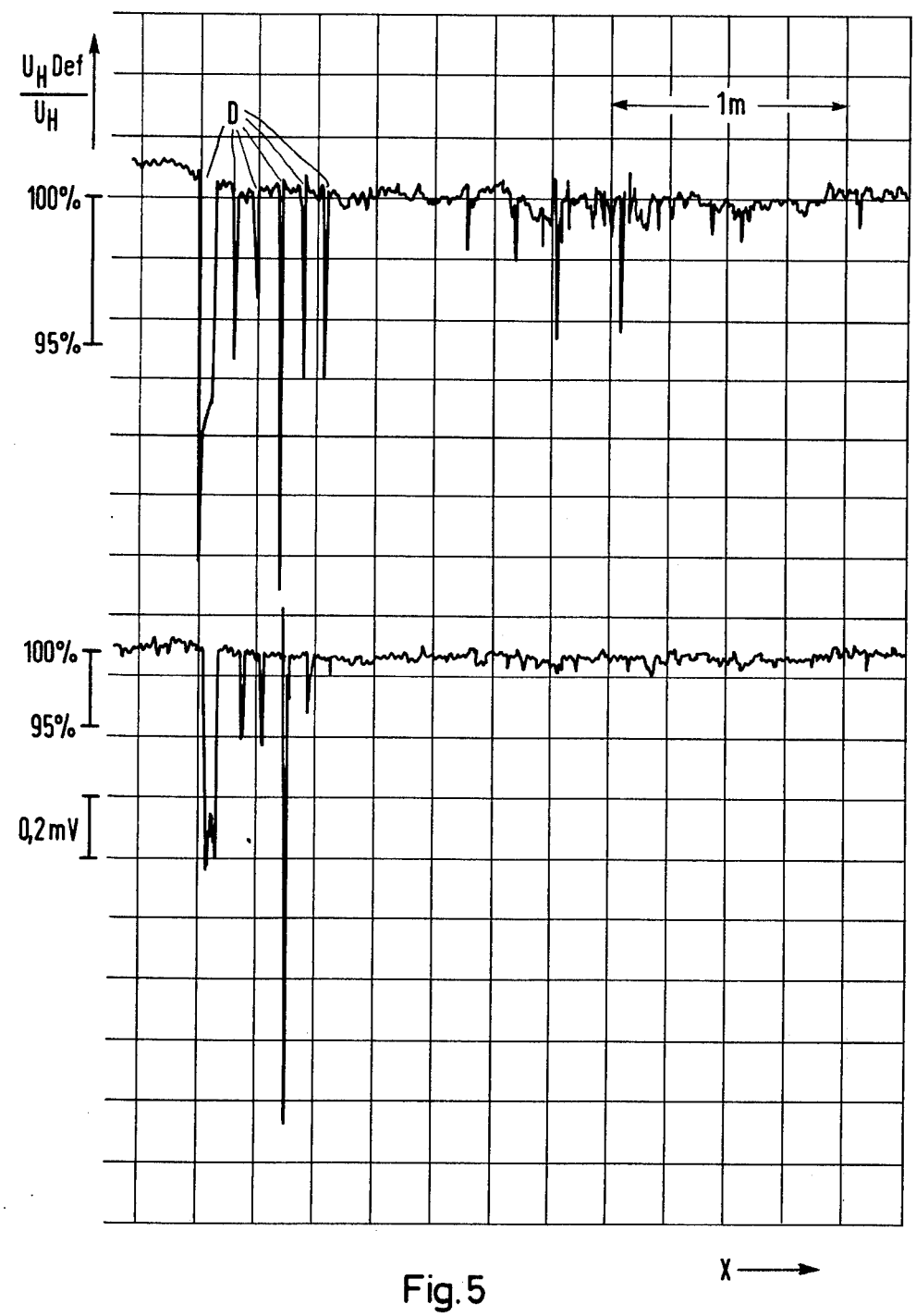
FIG. 5 is a diagram illustrating a measurement recording obtained with the apparatus of FIG. 4.

As an example of such recording, a corresponding graphic recording is shown in FIG. 5 for several meters of a conductor 30 with a diameter of about 3 mm. An aluminum wire with an outer niobium layer was used as the conductor. This niobium layer of the conductor section was damaged by filing at some defined points in such a manner that the underlying aluminum core became visible. Thereupon, this damaged conductor in wire form was pulled through two magnetic field regions 39 and 40 in an apparatus according to FIG. 4. In the graphic recording shown in the figure, the Hall voltage $U_H^{Def}$ produced at the Hall probes is reproduced as a function of the location x along the conductor. The percent figures on the ordinate serve as a scale and are referred to the Hall voltage $U_H$ of the undamage conductor. The lower curve shows the signal of the first magnetic field region 39. An external magnetic flux density of 0.24 Tesla was chosen for the two corresponding pairs of magnet coils. The distance between the two pairs of magnet coils in the lengthwise direction of the conductor was about 117 mm. In the left-hand part of the graphic recording according to FIG. 5, the signals designated D which were produced by the intentionally generated defects are seen. In the center of the upper curve, which is associated with the second magnetic field region 40, spike-shaped signals are clearly recorded, which are not present in the lower curve or only vestigially so. These are known as flux jumps and are brought about by magnetization reversal processes in running through the two magnetic field regions. It has now been found that these signals disappear if the magnetic field of the first magnetic field region 39 is reduced slightly. However, if the field is increased, corresponding signals appear in a denser sequence one after the other. It may therefore be advisable to choose different magnetic field strengths for the two pairs of magnet coils Flux jumps are then avoided to a large extent. In addition, the advantage is obtained that the first measuring device, which is associated with the magnetic field region 39, is relatively insensitive and registers mainly grave defects, while the measuring probes associated with the second field region 40 can react with high sensitivity even to very small defects.

In the embodiment according the figures above, the assumption of a solid conductor of circular cross section and with a superconducting surface was made. However, the conductor may also be a tubular, e.g., a hollow conductor, or may have another geometric shape, for instance, an elliptical cross section. Furthermore, more than two magnetic field regions e.g., 3 field regions, may be provided, the field directions of which are rotated relative to each other by about 60° in the circumferential direction of the conductor about the conductor axis.

I claim:

1. A method for the continuous, contactless testing of a long conductor which consists at least partially of superconductive material comprising moving the conductor, with its superconductive material in the superconducting state, through an external magnetic field which induces shielding currents in the superconductor material, and measuring the magnetic field produced by shielding currents by measuring means, wherein the improvement comprises carrying out the step of moving by moving the conductor through an external and at least approximately homogenous magnetic field comprising at least two spatially separated magnetic field regions disposed one behind the other in the lengthwise direction of the conductor, the fields of which have different flux densities and are angularly displaced about the longitudinal axis of the conductor through a predetermined angle with respect to each other in the circumferential direction, said measuring means of each magnetic field measuring independently with respect to each other.

2. Apparatus for the continuous contactless testing of a long conductor consisting at least partially of superconductive material comprising:
   (a) a cryostat;
   (b) at least two magnet coils for generating first and second external approximately homogenous magnetic field regions which are spaced along the axis of the conductor and which are angularly displaced relative to each other in the circumferential direction about the axis of the conductor, said magnetic field regions having different flux densities;
   (c) means within said cryostat for introducing the conductor into the magnetic field regions of the magnet coils and for deflecting the conductor therethrough so as to be approximately perpendicular to the coil axes and therefore, to the external magnetic field regions; and
   (d) at least two magnetic field probes provided in each of said magnetic field regions on opposite sides of said conductor in the field direction.

3. Apparatus according to claim 2 wherein said first and second spaced external magnetic field regions are each generated with a pair of opposing magnet coils disposed on opposite sides of the conductor and wherein the coil axis of one pair of magnet coils is angularly displaced relative to the axis of the other pair of magnet coils by approximately 90° in the circumferential direction of the conductor.

* * * * *